United States Patent
Chen et al.

(10) Patent No.: US 8,067,988 B2
(45) Date of Patent: Nov. 29, 2011

(54) LOW JITTER AND WIDE-RANGE FREQUENCY SYNTHESIZER FOR LOW VOLTAGE OPERATION

(75) Inventors: Chun-Liang Chen, Yongkang (TW); Hui-Chun Hsu, Bade (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 38 days.

(21) Appl. No.: 12/656,865

(22) Filed: Feb. 18, 2010

(65) Prior Publication Data
US 2010/0214025 A1   Aug. 26, 2010

(30) Foreign Application Priority Data
Feb. 20, 2009   (TW) .............................. 98105463 A

(51) Int. Cl.
*H03L 7/00* (2006.01)
(52) U.S. Cl. ............... 331/17; 331/183; 331/34; 331/16
(58) Field of Classification Search .................... 331/17, 331/183, 34, 16, 57
See application file for complete search history.

(56) References Cited

U.S. PATENT DOCUMENTS

| | | | |
|---|---|---|---|
| 6,522,208 B1 * | 2/2003 | Knowles | 331/34 |
| 6,535,070 B2 * | 3/2003 | Hwang et al. | 331/57 |
| 6,542,040 B1 * | 4/2003 | Lesea | 331/11 |

FOREIGN PATENT DOCUMENTS
TW   419899 B   1/2001

* cited by examiner

*Primary Examiner* — Arnold Kinkead
(74) *Attorney, Agent, or Firm* — Bacon & Thomas, PLLC

(57) ABSTRACT

A low jitter and wide-range frequency synthesizer for low voltage operation includes a detector to generate a detection signal based on a logic level difference between an input signal and a feedback signal, a charge pump to generate a control signal based on the detection signal, a filter to generate a tuning signal based on the control signal, a bias circuit to generate a first bias signal and a second bias signal based on the tuning signal, a controllable oscillator to generate a differential output signal based on the first and the second bias signals, a differential to single ended converter to convert the differential output signal into an output signal, and a programmable frequency divider to generate the feedback signal based on the output signal.

18 Claims, 14 Drawing Sheets

$f_{VCO}$ 100MHz

| Band | Vt | Ivco | Isupply (A) | CAP | Phase Noise (dBc) | Noise PWR ($V^2$/Hz) | RMS Jitter | P2P Jitter |
|---|---|---|---|---|---|---|---|---|
| 5 | 0.8 | 2.50E-04 | 5.605 | 7.50E-13 | -87.93 | 4.21E-09 | 1.83E-12 | 1.36E-11 |
| 4 | 0.9 | 4.03E-04 | 6.36 | 1.00E-12 | -90.33 | 2.42E-09 | 1.37E-12 | 1.02E-11 |
| 3 | 1.1 | 7.84E-04 | 8.46 | 1.56E-12 | -93.13 | 1.03E-09 | 8.46E-13 | 6.30E-12 |
| 2 | 1.3 | 1.23E-03 | 10.65 | 2.18E-12 | -94.84 | 8.60E-10 | 6.07E-13 | 4.52E-12 |
| 1 | 1.4 | 1.46E-03 | 11.8 | 2.80E-12 | -97.11 | 5.10E-10 | 5.38E-13 | 4.07E-12 |

FIG. 11

LOW JITTER AND WIDE-RANGE FREQUENCY SYNTHESIZER FOR LOW VOLTAGE OPERATION

BACKGROUND OF THE INVENTION

1. Field of the Invention

The present invention relates to the technical field of phase-locked loop (PLL) and, more particularly, to a low-jitter and wide-range frequency synthesizer for low voltage operation.

2. Description of Related Art

The essential challenge on designing the phase-locked loop (PLLs) required for Application Specific Integrated Circuit (ASICs) is that a large amount of frequencies, which are widely required for various products, should be flexibly generated at first, wherein the frequencies includes the system reference frequencies required for CPUs and the reference sampling frequencies required for the video or audio analog processors.

Accordingly, the range of the frequencies provided by the designed PLLs should be wide enough. For example, the frequencies are ranged from 10 MHz to 100 MHz for the video processors, but a few hundred KHz for the audio processors. In this case, the corresponding system processors require a frequency ranging from 500 MHz to 1 GHz, thus the range of the output frequency could be up to a multiple of 3000 to 10000 (the adjustable multiple of a voltage controlled oscillator (VCO) output frequency, e.g.: 1000M/100 kHz=10000). Owing to the variety of output frequencies, different PLL should be designed for different applications. Such a manner increases not only the management problem but also the developing costs for designing and testing the PLLs. Another solution is to design a single PLL applicable to different ICs, but how to design a PLL with a wide-range operation is a big challenge.

FIG. 1 is a block diagram of a typical PLL 100. In FIG. 1, the PLL 100 includes a phase detector 110, a charge pump 120, a filter 130, a VCO 140 and a frequency divider 150. When the PLL 100 is locked, the frequency of the signal $CK_{OUT}$ generated by the PLL 100 is N times of the frequency of the reference signal $CK_{REF}$.

When the frequency requirement is met, a further challenge is in the purity of the PLL output frequencies, i.e., the output jitters or phase noises in view of characteristic specification.

Even a PLL generates a clear, steady clock, the noises may damage the steadiness of the clock. The degree influenced by the noises can be judged by measuring the jitter amount of a PLL output. The common jitters are as follows:

1. Cycle-to-Cycle Jitter

As shown in FIG. 2, the cycle-to-cycle jitter indicates a cycle-to-cycle difference between two successive clocks. When the cycle-to-cycle jitter of a PLL reference frequency is greater than a certain degree, i.e., over the PLL hold range, it makes the PLL unlocked. Generally, the cycle-to-cycle jitter can be expressed by a root-mean-square (rms) value as follow:

$$J_c = \lim_{n \to \infty} \sqrt{\frac{1}{n}\sum_{i=1}^{n}(J_{ci})^2} = \lim_{n \to \infty} \sqrt{\frac{1}{n}\sum_{i=1}^{n}(t_i - t_{i-1})^2}.$$

2. Periodic Jitter

As shown in FIG. 3, the periodic jitter of each period indicates a phase difference between an actual clock $t_i$ and an ideal clock T of the period. When the cycle-to-cycle jitter becomes larger, the periodic jitter relatively becomes larger. With regard to designing a system timing, such as a setup time and a hold time, considering the periodic jitter is required for avoiding a clock disorder.

3. Long-Term Jitter

After the system is operated for a long time, the long-term jitter relatively generates a larger impact on the system. As shown in FIG. 4, an initial phase difference between the actual clock and the ideal clock is zero. After a long time $T_L$, the phase difference between the actual clock and the ideal clock is referred to as the long-term jitter, which would drift the operating point of the system.

The periodic jitter is generated by the imbalance or current leakage of a charge pump, and it generates a static phase offset between an output signal and a reference signal. For deep submicron technologies, due to the process shrinkage, the current leakage is increased exponentially, and simultaneously, the VCO tuning sensitivity of a typical PLL becomes very high, which causes the periodic jitter more serious under the requirements of low voltage and wide operating range. The long-term jitter is generated by a VCO phase difference. Because of the accumulation property of the phase errors and the leading change of the last output signal along the time axis, the long-term jitter of the output signal is increasingly accumulated in every transition.

Therefore, it is desirable to provide an improved frequency synthesizer to mitigate and/or obviate the aforementioned problems.

SUMMARY OF THE INVENTION

An object of the present invention is to provide a low jitter and wide-range frequency synthesizer, which is suitable for low voltage operation.

Another object of the present invention is to provide a low jitter and wide-range frequency synthesizer for low voltage operation, in which a capacitance bank controller dynamically sets a capacitance bank value in order to dynamically provide more load capacitance to each stage of delay cells to thereby filter out more phase noises of a controllable oscillator.

A further object of the present invention is to provide a low jitter and wide-range frequency synthesizer for low voltage operation, in which a controllable oscillator can have a higher control voltage than a typical one, so as to have a lower jitter by increasing the power consumption of the frequency synthesizer to.

To achieve the objects of the invention, a low jitter and wide-range frequency synthesizer for low voltage operation is provided. The frequency synthesizer includes a detector, a charge pump, a filter, a bias circuit, a controllable oscillator, a differential-to-single-ended converter and a programmable frequency divider. The detector generates a detection signal based on a logic level difference between an input signal and a feedback signal. The charge pump is connected to the detector in order to generate a control signal based on the detection signal. The filter is connected to the charge pump in order to generate a tuning signal based on the control signal. The bias circuit is connected to the filter in order to generate a first bias signal and a second bias signal based on the tuning signal. The controllable oscillator is connected to the bias circuit in order to generate a differential output signal based on the first and the second bias signals. The controllable oscillator includes an oscillator comprised of a plurality of delay cells, and a capacitance bank controller for controlling the delay cells to generate the differential output signal. The differential-to-single-ended converter is connected to the controllable oscillator in order to convert the differential output signal into an output signal. The programmable frequency divider is connected to the differential-to-single-ended converter in order to generate the feedback signal based on the output signal.

Other objects, advantages, and novel features of the invention will become more apparent from the following detailed description when taken in conjunction with the accompanying drawings.

BRIEF DESCRIPTION OF THE DRAWINGS

FIG. 11 is a table of parameters according to an embodiment of the invention;

DETAILED DESCRIPTION OF THE PREFERRED EMBODIMENT

Figure 1:
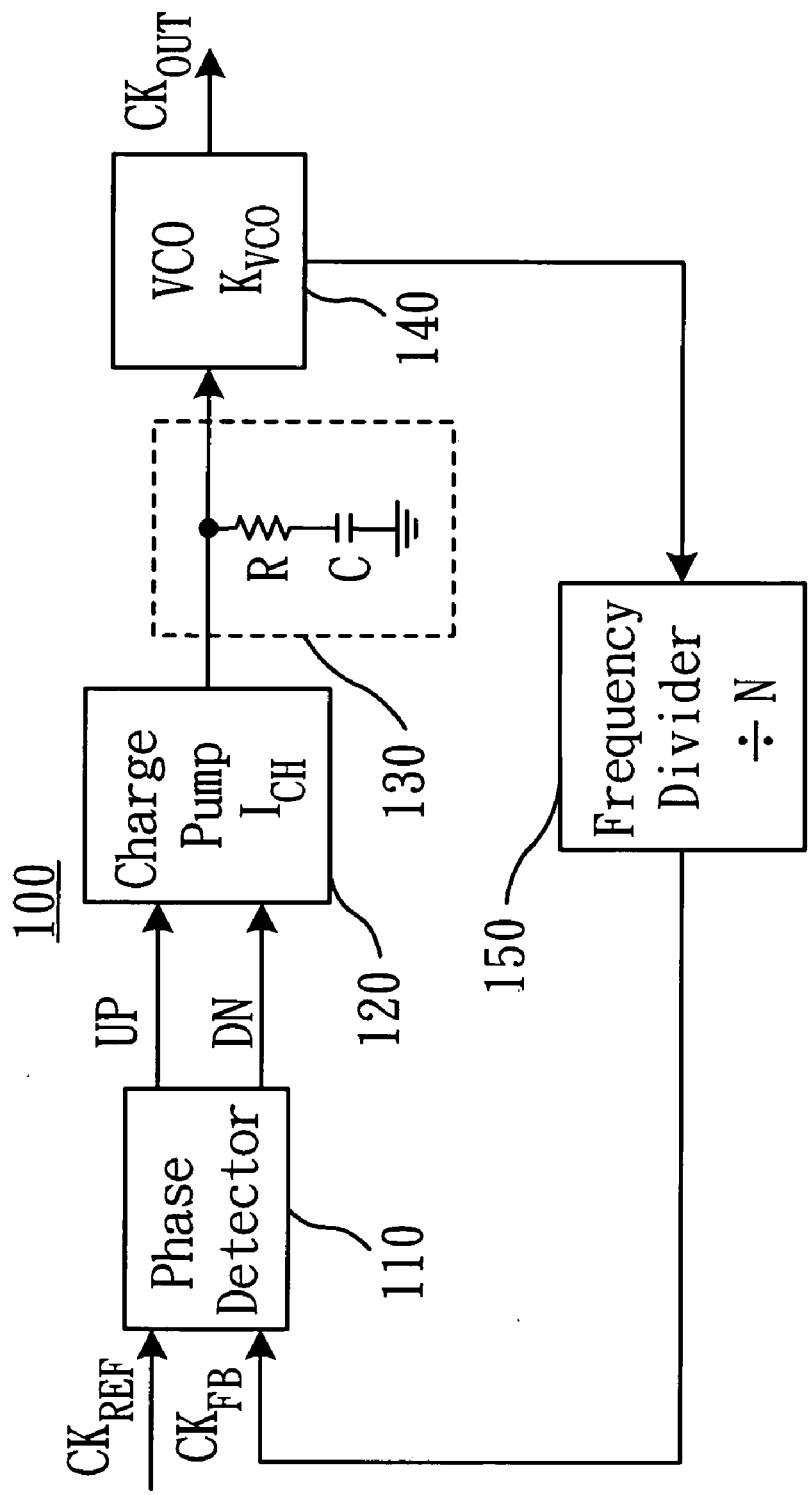
FIG. 1 is a block diagram of a typical PLL.
Figure 2:
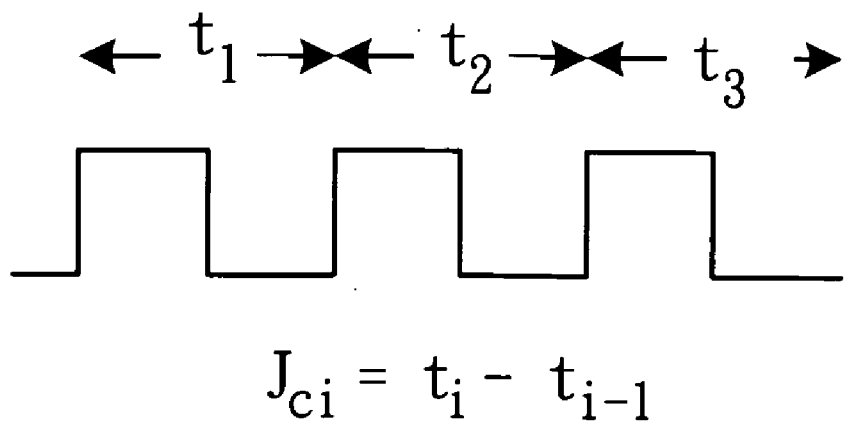
FIG. 2 is a schematic diagram of a typical cycle-to-cycle jitter.
Figure 3:
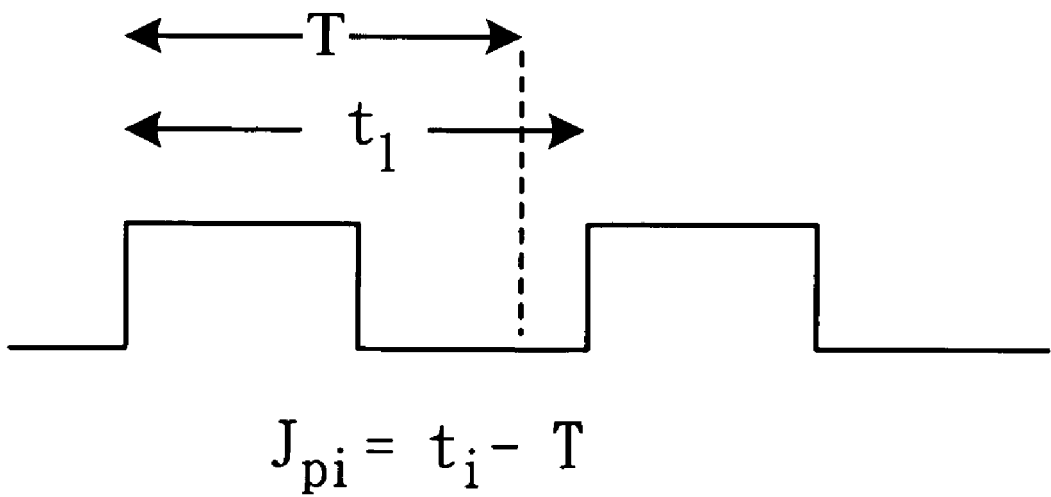
FIG. 3 is a schematic diagram of a typical periodic jitter.
Figure 4:
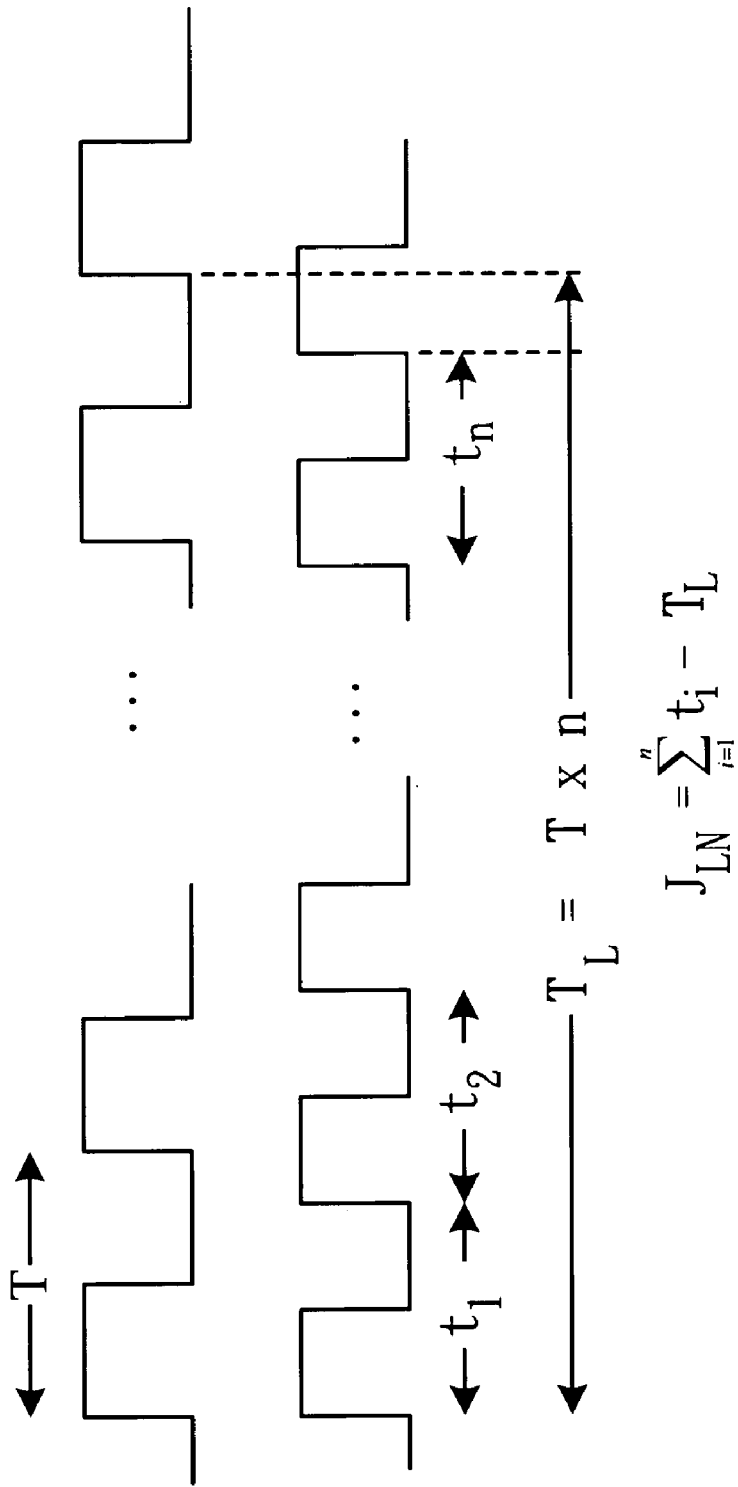
FIG. 4 is a schematic diagram of a typical long-term jitter.
Figure 5:
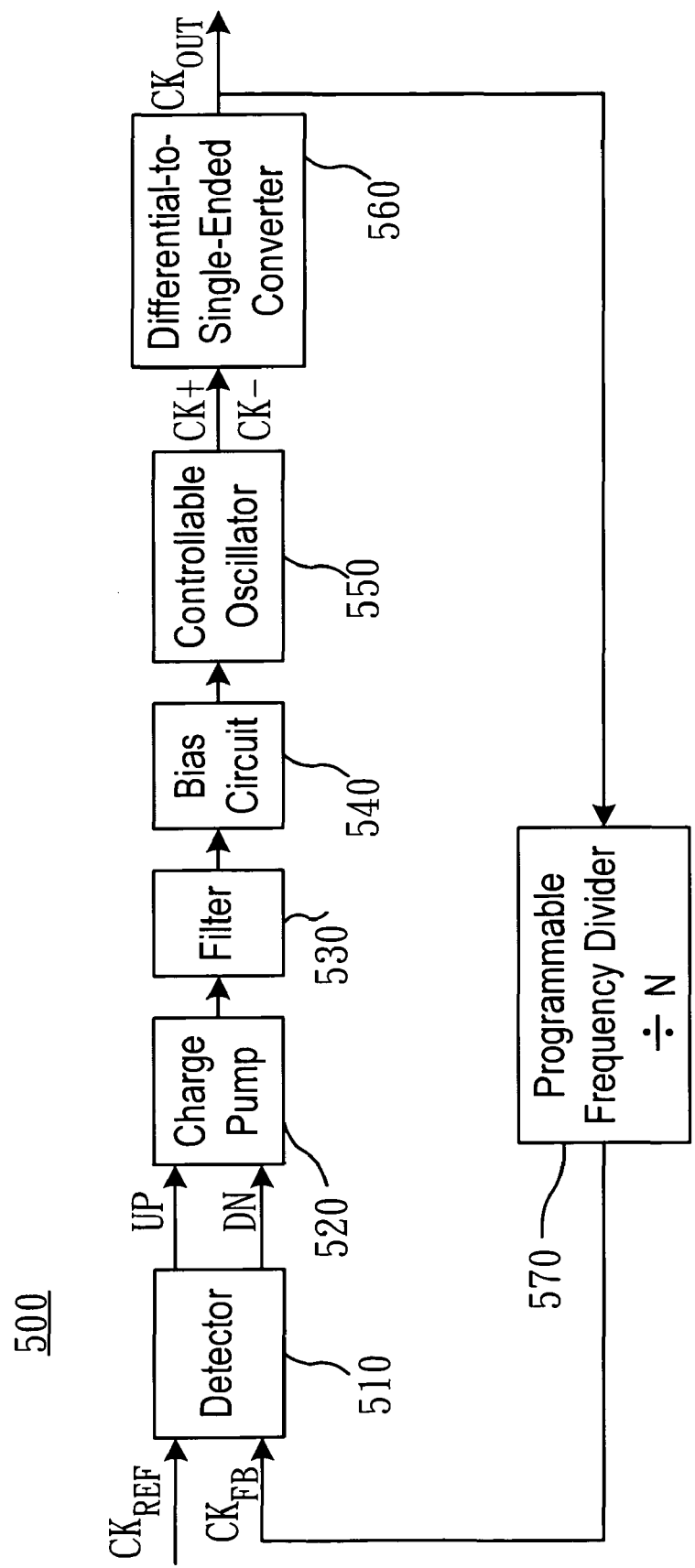
FIG. 5 is a block diagram of a low jitter and wide-range frequency synthesizer for low voltage operation according to an embodiment of the invention.

FIG. 5 is a block diagram of a low jitter and wide-range frequency synthesizer 500 for low voltage operation according to an embodiment of the invention. As shown in FIG. 5, the frequency synthesizer 500 includes a detector 510, a charge pump 520, a filter 530, a bias circuit 540, a controllable oscillator 550, a differential-to-single-ended converter 560 and a programmable frequency divider 570.

The detector 510 generates a detection signal based on a logic level difference between an input signal $CK_{REF}$ and a feedback signal $CK_{FB}$. The detector 510 adjusts the detection signal based on the phase relationship between the input signal $CK_{REF}$ and the feedback signal $CK_{FB}$, wherein the detection signal includes a frequency up signal UP and a frequency down signal DN.

When the phase of the input signal $CK_{REF}$ lags the phase of the feedback signal $CK_{FB}$, the detector 510 outputs an UP signal to activate the charge pump 520 to charge a capacitor (not shown). The voltage of the capacitor is increased by the charging operation to thereby arise the frequency $f_{VCO}$ of the output signal $CK_{OUT}$ from the differential to single ended converter 560. Thus, the phase lag of the input signal $CK_{REF}$ is compensated. Conversely, when the phase of the input signal $CK_{REF}$ leads the phase of the feedback signal $CK_{FB}$, the detector 510 outputs a DN signal to activate the charge pump 520 to discharge the capacitor. The voltage of the capacitor drops due to the discharging operation to thereby reduce the frequency $f_{VCO}$ of the output signal $CK_{OUT}$ from the differential to single ended converter 560. Thus, the phase lead of the input signal $CK_{REF}$ is pulled back to coincide with the phase of the feedback signal $CK_{FB}$.

The charge pump 320 is connected to the detector 510 in order to generate a control signal based on the detection signal.

The filter 530 is connected to the charge pump 520 in order to generate a tuning signal based on the control signal. The filter 530 is a low pass filter (LPF). The LPF filters out the high frequency component from the control signal to thereby generate the tuning signal. The LPF can be a passive loop filter comprised of passive elements, an active filter or a switched capacitor discrete time filter.

The bias circuit 540 is connected to the filter 530 in order to generate a first bias signal $V_{BP}$ and a second bias signal $V_{BN}$ based on the tuning signal.

Figure 6:
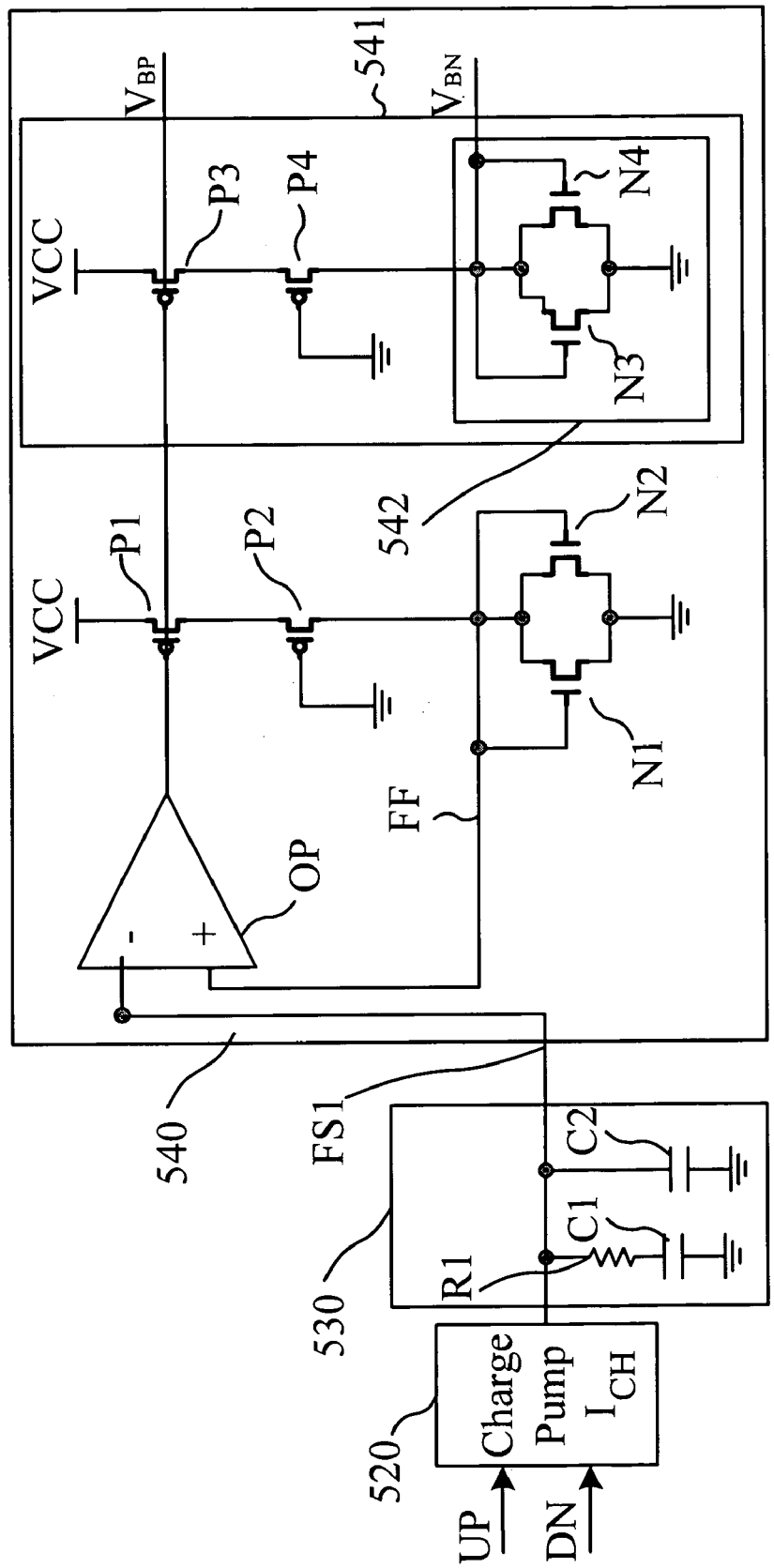
FIG. 6 is a circuit diagram of a low pass filter (LPF) and a bias circuit according to an embodiment of the invention.

FIG. 6 is a schematic diagram of the low pass filter (LPF) 530 and the bias circuit 540 according to an embodiment of the invention. The LPF 530 includes a first capacitor C1, a second capacitor C2 and a first resistor R1.

The second capacitor C2 has one end connected through a terminal FS1 to the charge pump 320, one end of the first resistor R1 and an inverse input terminal of the operational amplifier OP, and the other end connected to a low voltage. The first resistor R1 has the other end connected to one end of the first capacitor C1. The first capacitor C1 has the other end connected to the low voltage.

The bias circuit 540 includes the operational amplifier OP, a first PMOS transistor P1, a second PMOS transistor P2, a first NMOS transistor N1, a second NMOS transistor N2 and a voltage buffer 541. The voltage buffer 541 includes a third PMOS transistor P3, a fourth PMOS transistor P4 and a first symmetric load 542. The first symmetric load 542 includes a third NMOS transistor N3 and a fourth NMOS transistor N4.

The operational amplifier OP has an output terminal connected to a gate of the first PMOS transistor P1. The first PMOS transistor P1 has a source connected to a high voltage and a drain connected to a source of the second PMOS transistor P2. The second PMOS transistor P2 has a gate connected to the low voltage and a drain connected to a non-inverse input terminal of the operational amplifier OP and gates and drains of the first and the second NMOS transistors N1 and N2. The first and the second NMOS transistors N1 and N2 have a source connected to the low voltage.

The output terminal of the operational amplifier OP is connected to a gate of the third PMOS transistor P3 to thereby generate the first bias signal $V_{BP}$. The third PMOS transistor P3 has a source connected to a high voltage and a drain connected to a source of the fourth PMOS transistor P4. The fourth PMOS transistor P4 has a gate connected to the low voltage and a drain connected to gates and drains of the third and the fourth NMOS transistors N3 and N4 to thereby generate the second bias signal $V_{BN}$. The third and the fourth NMOS transistors N3 and N4 respectively have a source connected to the low voltage.

The controllable oscillator 550 is connected to the bias circuit 540 in order to generate a differential output signal CK+, CK− with a selectable specific frequency $f_{VCO}$ based on the first and the second bias signals $V_{BP}$ and $V_{BN}$.

The controllable oscillator 550 includes an oscillation circuit 700 to generate the differential output signal CK+, CK− with a selectable specific frequency $f_{VCO}$.

Figure 7:
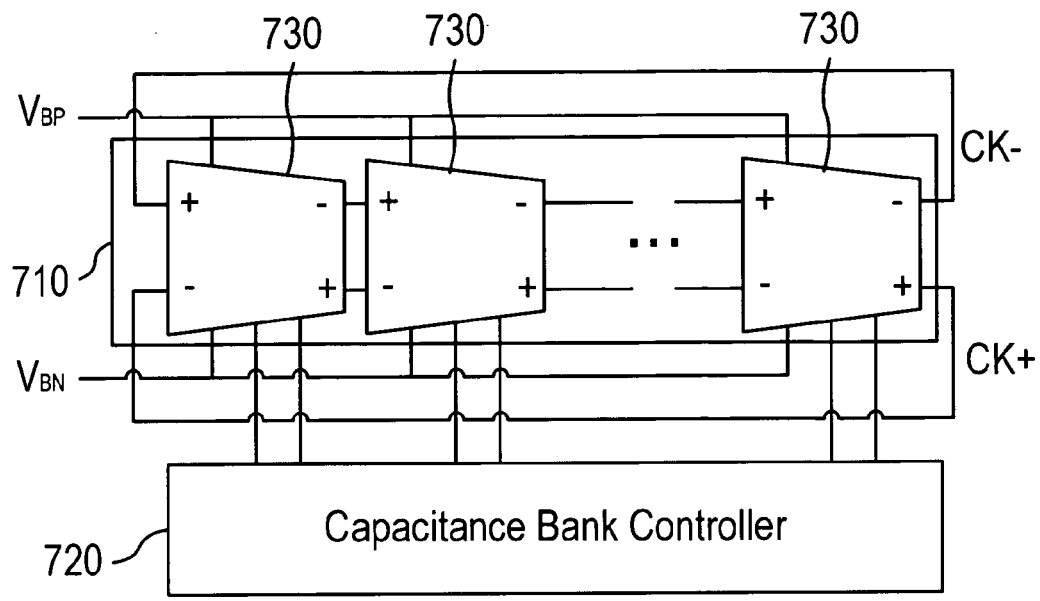
FIG. 7 is a block diagram of an oscillation circuit according to an embodiment of the invention.

FIG. 7 is a block diagram of the oscillation circuit 700 according to an embodiment of the invention. As shown in FIG. 7, the oscillation circuit 700 includes an oscillator 710 and a capacitance bank controller 720.

The oscillator 710 is comprised of a plurality of delay cells 730 to thereby generate the differential output signals CK+, CK− with the selectable specific frequency $f_{VCO}$. The capacitance bank controller 720 is connected to the delay cells 730 in order to control the delay cells 730 of the oscillator 710 to thereby generate the differential output signals CK+, CK− with the selectable specific frequency $f_{VCO}$.

Figure 8:
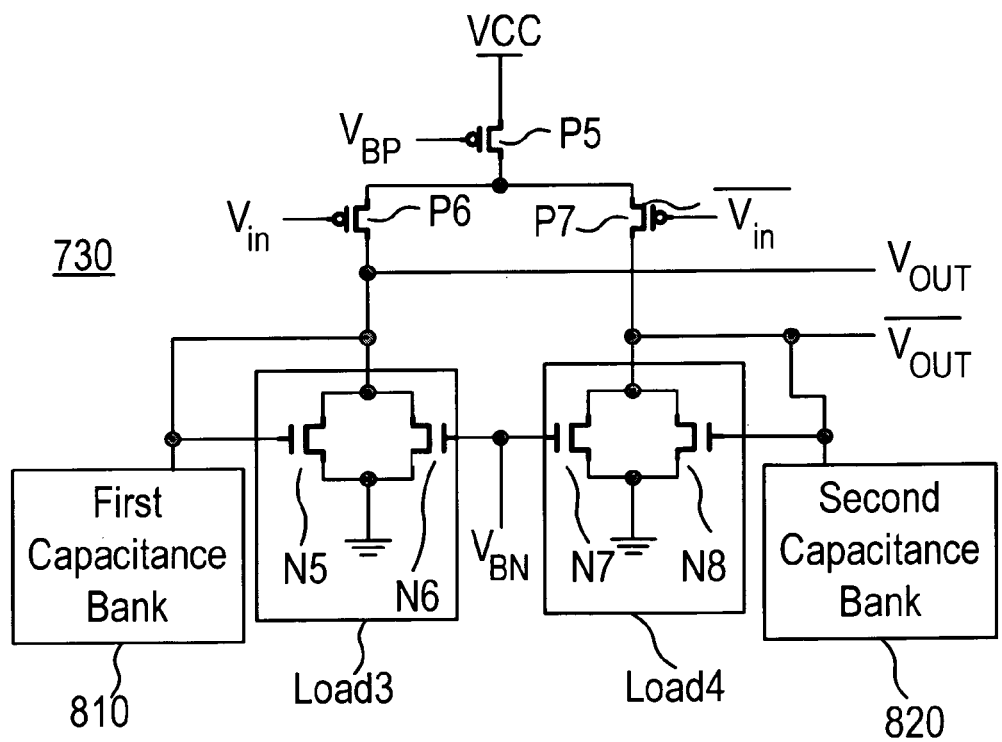
FIG. 8 is a block diagram of a delay cell according to an embodiment of the invention.

FIG. 8 is a block diagram of the delay cells 730 according to an embodiment of the invention. As shown in FIG. 8, each delay cell 730 includes a fifth PMOS transistor P5, a sixth PMOS transistor P6, a seventh PMOS transistor P7, a third symmetric load Load3, a fourth symmetric load Load4, a first capacitance bank 810 and a second capacitance bank 820. The third symmetric load has a fifth NMOS transistor N5 and a sixth NMOS transistor N6. The fourth symmetric load has a seventh NMOS transistor N7 and an eighth NMOS transistor N8.

The fifth PMOS transistor P5 has a source connected to the high voltage, a gate connected to the first bias signal $V_{BP}$, and a drain connected to a source of the sixth PMOS transistor P6 and a source of the seventh PMOS transistor P7. The sixth PMOS transistor P6 has a drain connected to a drain and a gate of the fifth NMOS transistor N5 and a drain of the sixth NMOS transistor N6. The seventh PMOS transistor P7 has a drain connected to a drain and a gate of the eight NMOS transistor N8 and a drain of the seventh NMOS transistor N7. The sixth and the seventh NMOS transistors N6 and N7 respectively have a gate connected to the second bias signal $V_{BN}$. The fifth, the sixth, the seventh and the eighth NMOS transistors respectively have a source connected to the low voltage. The first capacitance bank 810 is connected to the gate of the fifth NMOS transistor N5, and the second capacitance bank 820 is connected to the gate of the eighth NMOS transistor N8.

Figure 9:
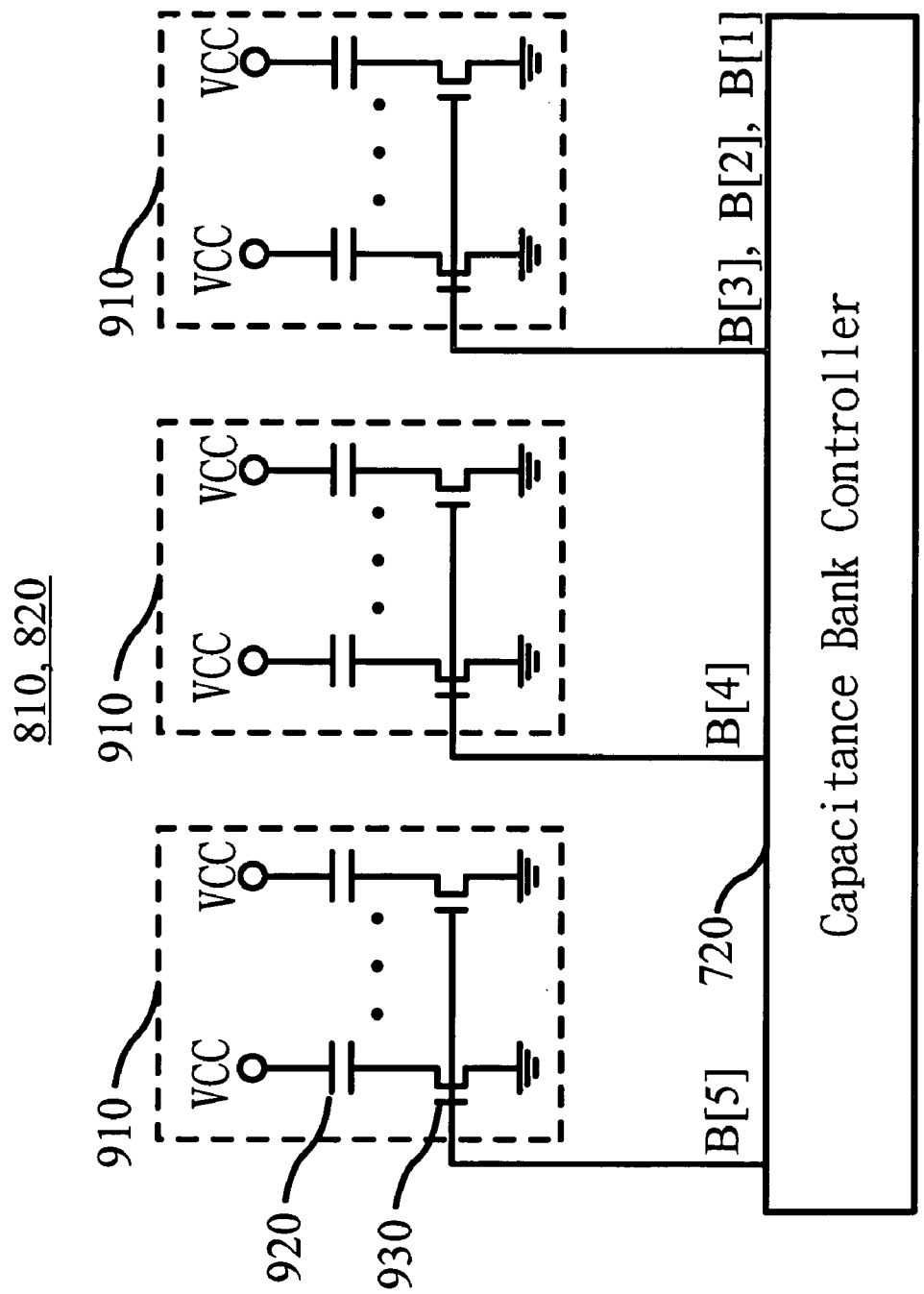
FIG. 9 is a circuit diagram of first and second capacitance banks according to an embodiment of the invention.

FIG. 9 is a circuit diagram of the first capacitance bank 810 and the second capacitance bank 820 according to an embodiment of the invention. As shown in FIG. 9, the first capacitance bank 810 and the second capacitance bank 820 both include a plurality of capacitance selectors 910, and each capacitance selector has N capacitors 920 and N switches 930, where N is a positive integer.

The N switches 930 of each capacitance selector 910 each can be NMOS transistor with a gate connected to the capacitance bank controller 720.

In this embodiment, the capacitors of each capacitance selector 910 can be a base-emitter junction capacitor, a MOSFET capacitor or a poly-poly capacitor. In other embodiments, the capacitors of each capacitance selector 910 can be a metal-insulator-metal (MIM) capacitor.

As shown in FIG. 9, the capacitors of the first and the second capacitance banks 810 and 820 can respectively be expressed as:

$(C_{Paracitic}+B[1]\times C_{B1}+B[2]\times C_{B2}+B[3]\times C_{B3}+B[4]\times C_{B4}+B[5]\times C_{B5})$, where $C_{Paracitic}$ indicates parasitic and stray capacitance, and B[1], B[2], B[3], B[4], B[5] indicate control signals outputted from the capacitance bank controller 720 to each of the first and the second capacitance banks 810 and 820. When B[j]=0 (for j=1 to 5), the corresponding NMOS transistors are turned off, and the capacitors are considered to be floating without providing any capacitor effect. When B[j]=1, the corresponding NMOS transistors are turned on, and the capacitors are considered to be grounded to thereby provide the capacitor effect. Thus, the frequency $f_{VCO}$ of the differential output signals CK+, CK− output by the controllable oscillator 550 is expressed as:

$$f_{VCO} = \frac{g_m}{C_B}$$
$$= \frac{g_m}{2n \times C_{Eff}}$$
$$= \frac{g_m}{2n \times \begin{pmatrix} C_{Eff} + CB[1]\times C_{B1} + CB[2]\times C_{B2} + \\ CB[3]\times C_{B3} + CB[4]\times C_{B4} + CB[5]\times C_{B5} \end{pmatrix}}$$

The differential-to-single-ended converter 560 is connected to the controllable oscillator 550 in order to convert the differential output signals CK+, CK− into an output signal $CK_{OUT}$. The differential-to-single-ended converter 560 can be replaced with a frequency divider with a divisor of two in order to improve the positive and negative edge symmetry (50% duty cycle) of the output signal $CK_{OUT}$.

The programmable frequency divider 570 is connected to the differential-to-single-ended converter 560 in order to generate the feedback signal $CK_{FB}$ based on the output signal $CK_{OUT}$.

In order to prove the effective improvement and show the purpose of the invention, the following analysis is given for illustrative purpose.

The control configuration of the oscillator 710 in FIG. 7 is a ring oscillator. The jitter in such a ring oscillator is related to the selection and implementation of the ring oscillator design configuration. In an optimal ring oscillator, the jitter is generated by thermal noises and shot noises of the active and passive elements of the delay cells. Accordingly, reducing the impact of the thermal noises and shot noises of the delay cells is a key of reducing the jitter. The jitter and the phase noise in a PLL are hard to predict by a typical simulator.

Figure 10:
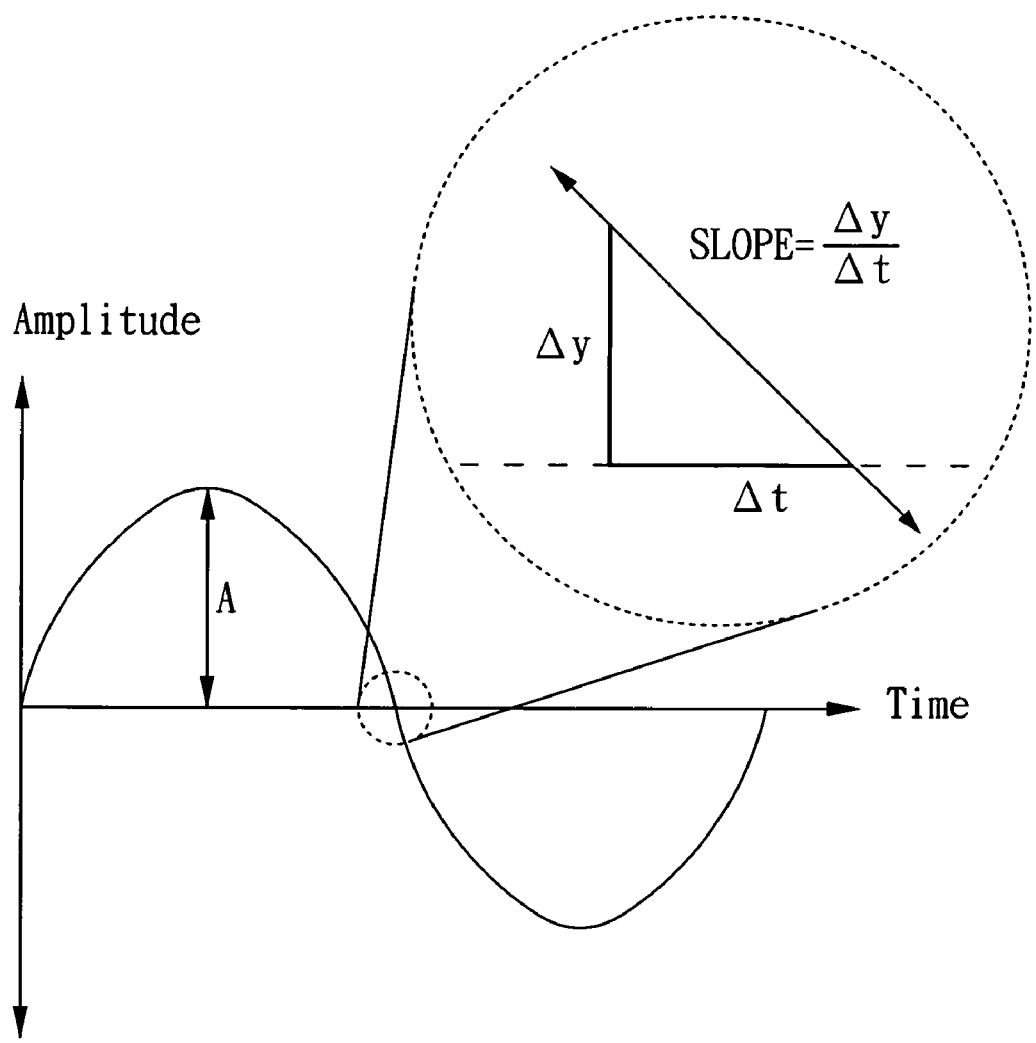
FIG. 10 is a schematic diagram illustrating a signal impacted by a jitter according to an embodiment of the invention.

FIG. 10 is a schematic diagram illustrating a signal impacted by a jitter. As shown in FIG. 10, the noise voltage Δy at the zero-crossing causes the signal to arrive at the zero-crossing by Δt in advance. Upon a first crossing approximation, the jitter can be expressed as:

$$Jitter_{RMS} = \frac{V_{nRMS}}{A\omega}, \qquad (1)$$

where $Jitter_{RMS}$ indicates a root mean square (rms) of a jitter, $v_{nRMS}$ indicates a root mean square of a noise signal, A indicates an amplitude of a signal, and ω indicates a frequency of the signal.

The thermal noises contribute to the timing changes on the differential output terminals. A typical noise analysis skill is used to determine an output voltage noise by integrating the noise spectrum density. The integration is performed by integrate a bandwidth of an LPF, and the bandwidth depends on the load resistance and capacitance of a following stage. Accordingly, the rms of a jitter on a single stage can be expressed as:

$$J_{1rms} = \frac{\sqrt{\frac{2kT}{C_{eff}}} \cdot \left(\sqrt{1 + \frac{2}{3}a_v}\right)}{A\omega}, \quad (2)$$

where $a_v$ indicates a gain of a small signal, $C_{eff}$ indicates an equivalent capacitance, k indicates Boltzmann constant, i.e., $k=1.38\times10^{-23}$, and T indicates a Kevin temperature. The voltage change on Equation (2) can be regarded as a sum of thermal noises at each node of the delay cell 730 shown in FIG. 8. When the time-variant feature of the noises is considered, the rms of the jitter on the single stage can be rewritten as:

$$J_{1rms} = \frac{\sqrt{\frac{2kT}{C_{eff}}} \cdot \frac{1}{(V_{GS} - V_t)} \cdot \left(\sqrt{1 + \frac{2}{3}a_v(1 - e^{-t/\tau}) + \frac{2\sqrt{2}}{3}a_v e^{-t/\tau}}\right)}{A\omega}, \quad (3)$$

where $V_{GS}$ indicates a gate-source voltage of a transistor, $V_t$ indicates an equivalent capacitance, and $\tau$ indicates a time constant.

Upon the first crossing approximation, each cycle jitter or a cycle-to-cycle jitter can be expressed as:

$$J_{1rms} = \frac{\sqrt{\frac{2kT}{C_{eff}}} \cdot \left(\frac{T_{VCO}}{2n \cdot C_{eff}}\right) \cdot (\beta) \cdot \left(\sqrt{1 + \frac{2}{3}a_v(1 - e^{-t/\tau}) + \frac{2\sqrt{2}}{3}a_v e^{-t/\tau}}\right)}{A \cdot \frac{2\pi}{T_{VCO}}} \propto C_{eff}^{3/2}. \quad (4)$$

The frequency $f_{VCO}$ of the differential output signal CK+, CK− from the controllable oscillator 550 can be expressed as:

$$f_{VCO} = \frac{1}{2n \cdot R_{Load} \cdot C_{eff}} \Rightarrow R_{Load} = \frac{T_{VCO}}{2n \cdot C_{eff}}, \quad (5)$$

$$\text{so } R_{Load} = \frac{1}{g_{m\_VCOCell}} = \frac{1}{\beta(V_{GS} - V_T)}. \quad (6)$$

From Equation (5) and Equation (6), Equation (7) is derived as follows:

$$\frac{1}{(V_{GS} - V_T)} = \left(\frac{T_{VCO}}{2n \cdot C_{eff}}\right) \cdot (\beta), \text{ where } \beta = \mu_n C_{ox} \frac{W}{L}. \quad (7)$$

With regard to designing a low jitter circuit, the parameter $(V_{GS}-V_T)$ for the self-bias controllable oscillator 550 is selected to be as high as possible, while the parameter $a_v$ ranges from 1.3 to 3.

From Equation (4), it is known that the increase on the parameter $C_{eff}$ can improve the jitter when the other parameters in design are fixed. However, the increase on the parameter $C_{eff}$ is linear to the power consumption. Namely, the improvement on the power consumption and the jitter presents a mutually exclusive effect.

Figure 12:
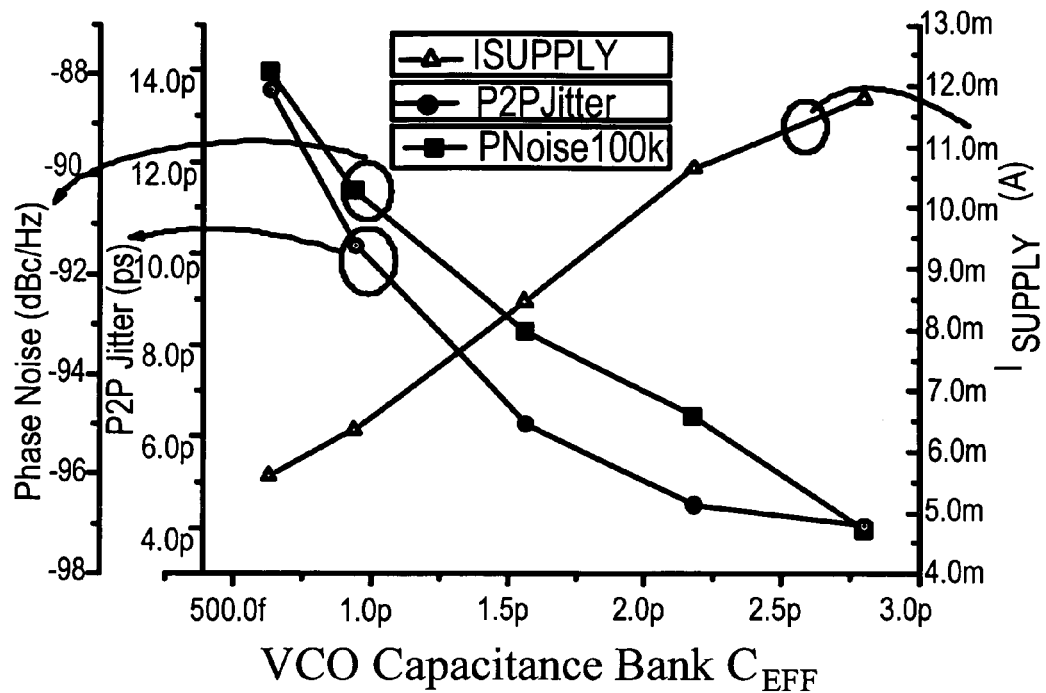
FIG. 12 is a schematic diagram of simulation of a voltage controlled oscillator (VCO) according to an embodiment of the invention.

The invention uses a Spectre-RF simulator supplied by Cadence to simulate the phase noise and jitters of the VCO. FIG. 11 shows a table of parameters according to an embodiment of the invention. As shown in FIG. 11, the parameters include the rms jitter, the power consumption $I_{VCO}$, and the VCO load capacitance CAP. FIG. 12 is a schematic diagram of simulation of a voltage controlled oscillator (VCO) according to an embodiment of the invention. As shown in FIG. 12, the VCO jitter is inversely proportional to the effective VCO load capacitance $C_{EFF}$ and directly proportional to the power consumption $I_{SUPPLY}$. This result is consistent with Equation (4) derived from the principles.

Figure 13:
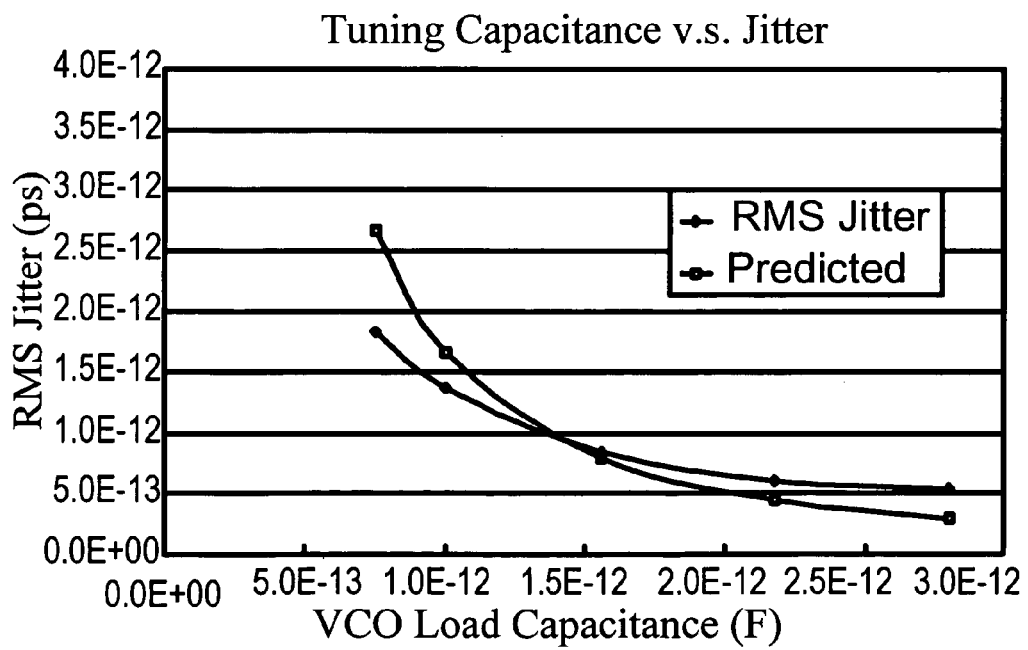
FIG. 13 is a schematic diagram of root mean square jitter versus VCO load capacitance according to an embodiment of the invention.

FIG. 13 is a schematic diagram of root mean square (rms) jitter versus VCO load capacitance (CAP) according to an embodiment of the invention. As shown in FIG. 13, the timing jitter is reduced more and more with the increasing $$C_{eff}^{\frac{3}{2}}.$$

Namely, the jitter is reduced by means of increasing the capacitance.

Figure 14:
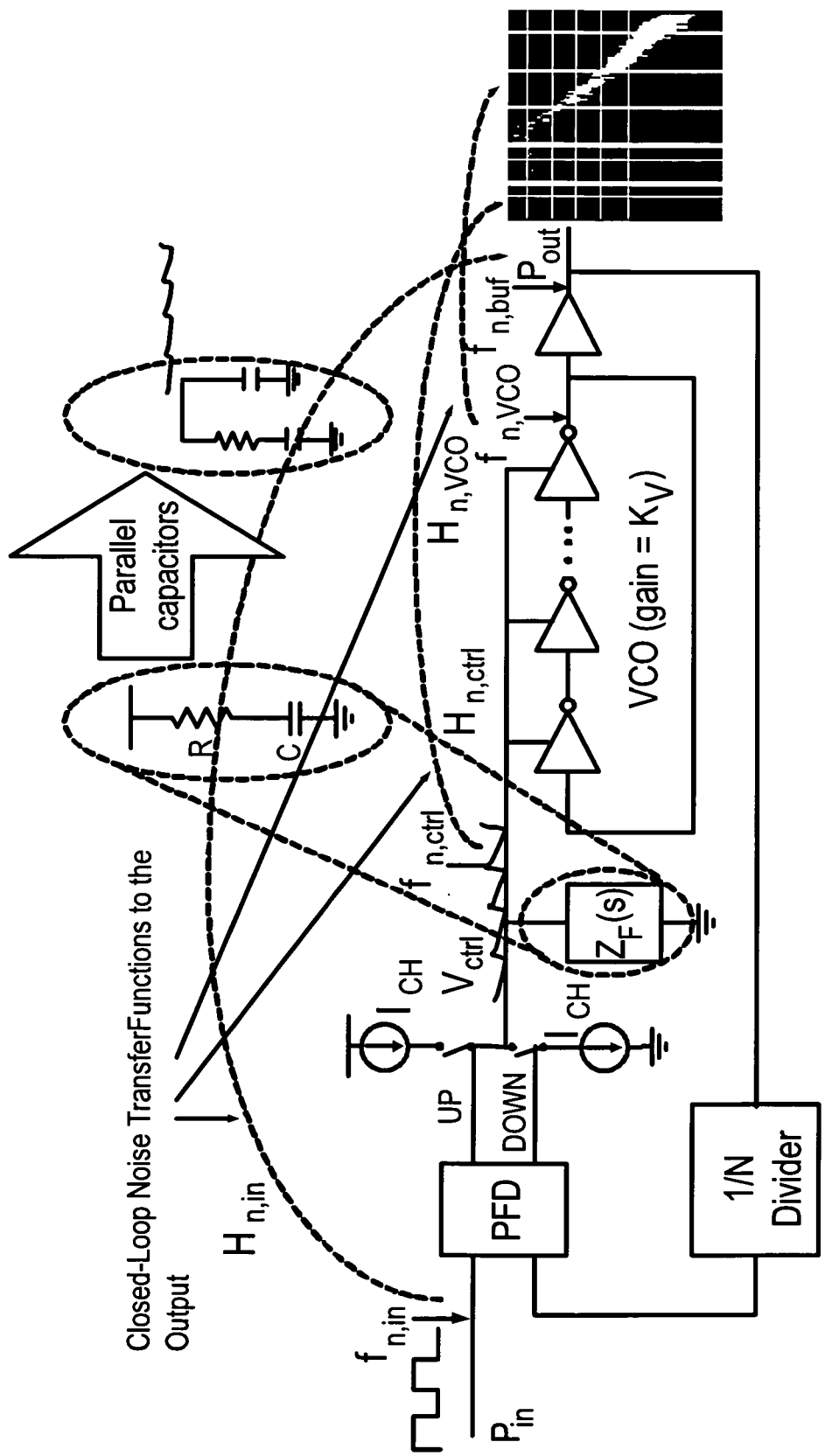
FIG. 14 is a schematic diagram of a periodic jitter generated by noises of a control line.
Figure 15:
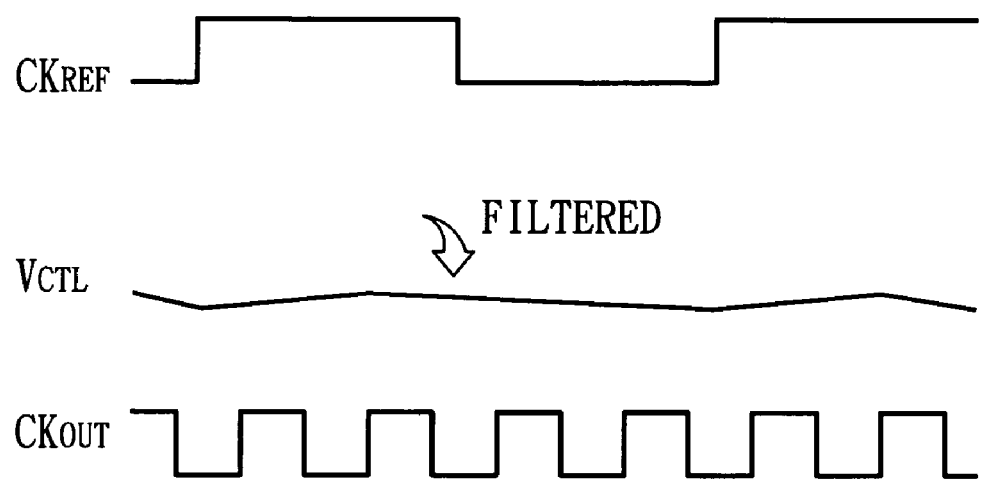
FIG. 15 is a schematic diagram of waveforms of a control line voltage, an input signal and an output signal.

FIG. 14 is a schematic diagram of a periodic jitter generated by noises of a control line according to an embodiment of the invention. FIG. 15 is a schematic diagram of waveforms of a control line voltage $V_{CTL}$, an input signal $CK_{REF}$, and an output signal $CK_{OUT}$ according to an embodiment of the invention. As shown in FIGS. 14 and 15, the non-ideal features of the PLL cause the disturbance of the control line, and the non-ideal features include the thermal noises and asymmetry of the charge pump, the current leakage, the charge injection and timing crossing, the thermal noises of the filter, and the asymmetry of the phase detector. The phase difference between the noises and the PLL of the control line can be expressed as:

$$\theta_{out}^2 = \left(\frac{1}{1 + G(s)H(s)}\right)^2 \cdot \left(V_{n,ctrl\_line} \cdot \frac{2\pi K_{VCO}}{s}\right)^2. \quad (8)$$

From Equation (8), a high VCO (tuning) sensitivity $K_{VCO}$ can cause more noises of the control line, but the higher the VCO sensitivity $K_{VCO}$ is, the easier the VCO is tuned. Accordingly, on designing a wide-range PLL, it requires a tradeoff between the frequency tuning range and the period jitter.

As shown in FIG. 14, a parallel capacitor is added in the filter of a typical PLL to thereby generate a three-stage pole, which can spread the disturbance received by the control line voltage $V_{CTL}$, thereby introducing the average concept. However, when the process enters into the deep-submicron level, the elements of the filter, including passive and active devices, have more serious current leakage to thereby make the pole increment approach fail.

The oscillator 710 in the invention is comprised of delay cells 730 in a differential ring oscillator configuration of the positive output terminal of a preceding stage connected to the negative input terminal of a following stage and the negative output terminal of the preceding stage connected to the positive input terminal of the following stage. The oscillator 710 has a sensitivity $K_{VCO}$ derived and expressed by the parameters $g_m$ and $C_B$ as follows.

If the oscillator 710 is a three-stage VCO, the frequency $f_{VCO}$ can be expressed as:

$$f_{VCO} = \frac{1}{2n \cdot R_{VCO} C_{eff}}, \text{ so}$$

$$f_{VCO} = \frac{1}{2n \cdot R_{VCO} \cdot C_{eff}} = \frac{1}{2n \cdot \frac{1}{\frac{g_{m\_VCOCell}}{1/R}} \cdot C_{eff}}$$

$$= \frac{g_{m\_VCOCell}}{2nC_{eff}} = \frac{g_{m\_VCOCell}}{C_B}$$

$$= \frac{\beta(V_{GS} - V_T)}{C_B} = \frac{\sqrt{2\beta \cdot I_D}}{C_B},$$

where $C_B$ indicates a capacitance of the controllable oscillator 550, n indicates the number of delay cells 730, $C_{Eff}$ indicates a capacitance of the delay cells 730, and $g_m$ indicates a transconductance of the delay cells 730, and the sensitivity $K_{VCO}$ can be expressed as:

$$K_{VCO} = \frac{df}{dV} = \frac{\beta}{C_B}. \tag{9}$$

Figure 16:
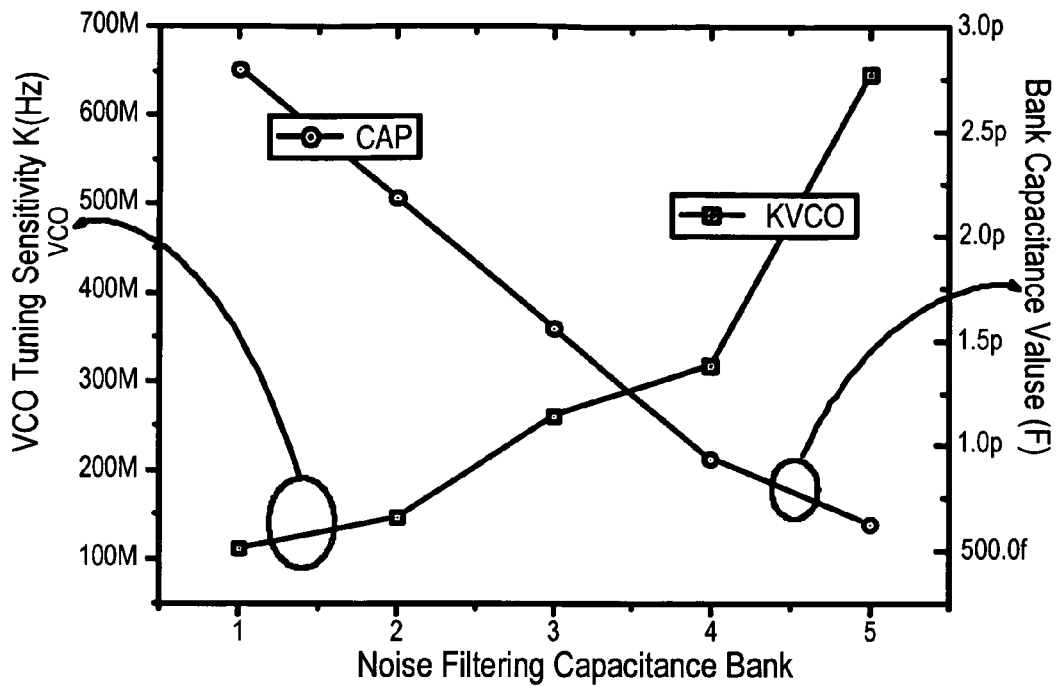
FIG. 16 is a schematic diagram of corresponding VCO tuning sensitivity, noise filtering capacitance bank and bank capacitance value.

From Equation (9), it is obvious that increasing the capacitance load $C_B$ can lower the VCO sensitivity $K_{VCO}$. Therefore, the programmable capacitance bank controller 720, the first capacitance bank 810 and the second capacitance bank 820 can tune and adjust the total VCO capacitance load to a value of $6C_{Eff}$. FIG. 16 is a schematic diagram of corresponding VCO tuning sensitivity $K_{VCO}$, noise filtering capacitance bank and bank capacitance value according to an embodiment of the invention, which indicates the influence of the sensitivity $K_{VCO}$ when the capacitance load $C_B$ is increased.

Figure 17:
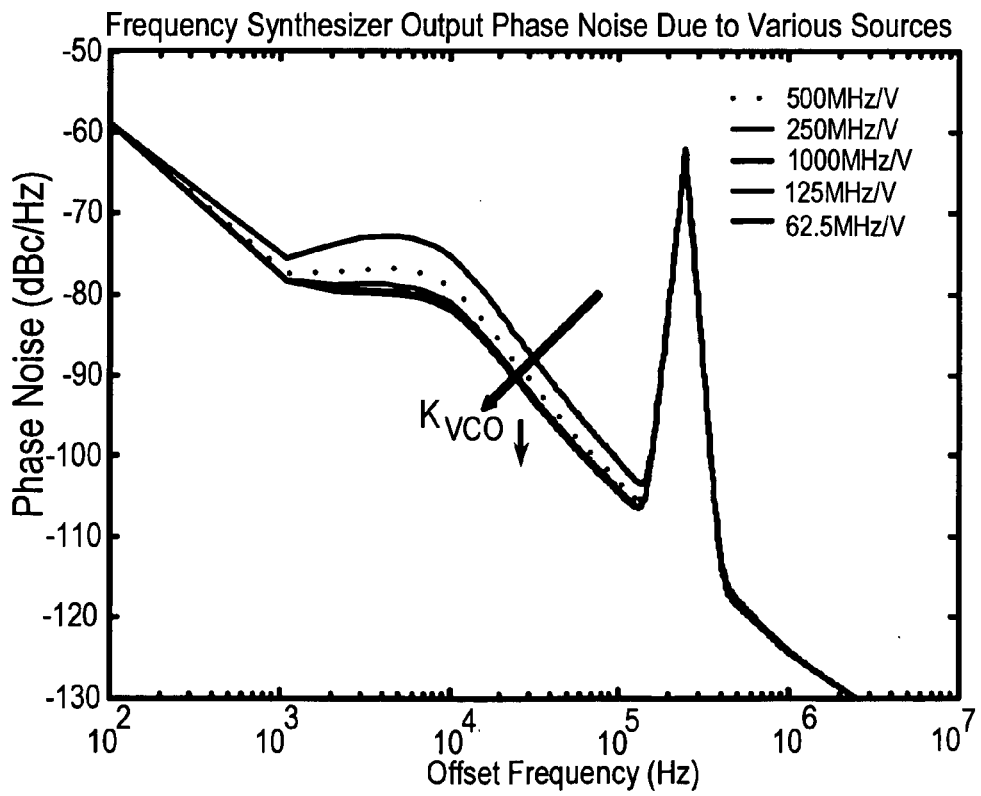
FIG. 17 is a schematic diagram of phase noise versus VCO tuning sensitivity.

Therefore, the disturbance of the control line, which causes the PLL to generate noises, can cause the PLL a smaller jitter by reducing the VCO sensitivity $K_{VCO}$. FIG. 17 is a schematic diagram of phase noise versus offset frequency according to an embodiment of the invention. As shown in FIG. 17, the higher sensitivity $K_{VCO}$ causes a greater phase noise at the band edges.

Figure 18:
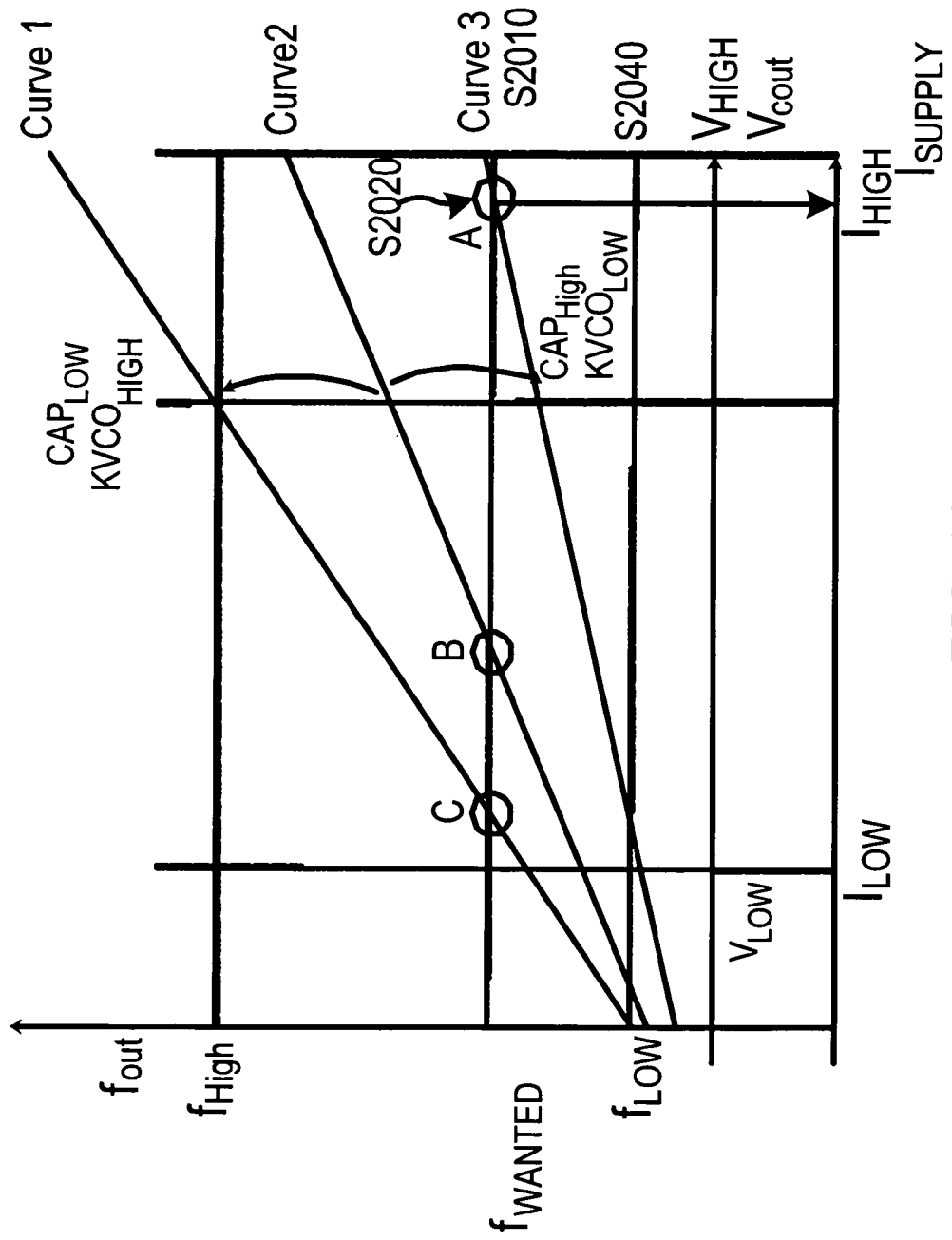
FIG. 18 is a schematic diagram of low jitter phase locked loop (PLL) according to an embodiment of the invention.

FIG. 18 is a schematic diagram of low jitter phase locked loop (PLL) according to an embodiment of the invention. As shown in FIG. 18, step S2010 increases the capacitance to the highest value, i.e., Curve 3. Step S2020 ensures the frequency-adjusted curve (Curve 3) to cover the desired frequency $f_{WANTED}$. Step S2030 finds a desired resistance. The PLL locks at a highest control voltage, and the value of the highest control voltage is limited by the supplied power VDD. The smallest resistance of each stage of the VCO is shown at the point A in FIG. 18, and accordingly the power consumption, i.e., current value $I_{HIGH}$, is determined in step S2040 to thereby obtain a low jitter PLL.

As cited, the invention uses the capacitance bank controller 720 to control the capacitance values of the capacitance banks 810 and 820 to thereby provide more load capacitance to each stage of delay cells 730 dynamically and filter out more phase errors of the controllable oscillator 550. In addition, as compared to the prior art, the invention uses the capacitance bank controller 720 to dynamically set the capacitance values of the capacitance banks 810 and 820 to thereby allow a higher control voltage to control the controllable oscillator 550 and reduce the power consumption and jitter of the PLL. Therefore, the PLL can be implemented in an integrated circuit (IC) easier than the prior art.

Although the present invention has been explained in relation to its preferred embodiment, it is to be understood that many other possible modifications and variations can be made without departing from the spirit and scope of the invention as hereinafter claimed.

What is claimed is:

1. A frequency synthesizer, comprising:
    a detector, for generating a detection signal based on a logic level difference between an input signal and a feedback signal;
    a charge pump, connected to the detector, for generating a control signal based on the detection signal;
    a low pass filter connected to the charge pump, for generating a tuning signal based on the control signal;
    a bias circuit connected to the low pass filter, for generating a first bias signal and a second bias signal based on the tuning signal;
    a controllable oscillator, connected to the bias circuit, for generating a differential output signal based on the first and the second bias signals, the controllable oscillator including an oscillator comprised of a plurality of delay cells, and a capacitance bank controller for controlling the delay cells to generate the differential output signal for further selecting a specific frequency thereby dynamically providing load capacitance to the plurality of delay cells and filtering out phase errors of the controllable oscillator;
    a differential-to-single-ended converter, connected to the controllable oscillator, for converting the differential output signal into an output signal; and
    a programmable frequency divider, connected to the differential-to-single-ended converter, for generating the feedback signal based on the output signal,
    wherein the LPF comprises a first capacitor, a second capacitor and a first resistor, the second capacitor has a first end connected through a terminal to the charge pump and a first end of the first resistor and a second end connected to a low voltage, the first resistor has a second end connected to a first end of the first capacitor, and the first capacitor has a second end connected to the low voltage.

2. The frequency synthesizer as claimed in claim 1, wherein the bias circuit comprises an operational amplifier, a first PMOS transistor, a second PMOS transistor, a first NMOS transistor, a second NMOS transistor and a voltage buffer, the operational amplifier has an output terminal connected to a gate of the first PMOS transistor, the first PMOS transistor has a source connected to a high voltage and a drain connected to a source of the second PMOS transistor, the second PMOS transistor has a gate connected to the low voltage and a drain connected to a non-inverse input terminal of the operational amplifier, and the gate and the drain of the first NMOS transistor, the gate and the drain of the second NMOS transistor and the sources of the first and the second NMOS transistors are respectively connected to the low voltage.

3. The frequency synthesizer as claimed in claim 2, wherein the voltage buffer comprises a third PMOS transistor, a fourth PMOS transistor and a first symmetric load.

4. The frequency synthesizer as claimed in claim 3, wherein the first symmetric load comprises a third NMOS transistor and a fourth NMOS transistor.

5. The frequency synthesizer as claimed in claim 4, wherein the output terminal of the operational amplifier is connected to a gate of the third PMOS transistor to thereby generate the first bias signal, the third PMOS transistor has a source connected to the high voltage and a drain connected to a source of the fourth PMOS transistor, the fourth PMOS transistor has a gate connected to the low voltage and a drain respectively connected to gates and drains of the third and the fourth NMOS transistors to thereby generate the second bias signal, and the third and the fourth NMOS transistors respectively have a source connected to the low voltage.

6. The frequency synthesizer as claimed in claim 5, wherein each delay cell comprises a fifth PMOS transistor, a sixth PMOS transistor, a seventh PMOS transistor, a second symmetric load, a third symmetric load, a first capacitance bank and a second capacitance bank.

7. The frequency synthesizer as claimed in claim 6, wherein second symmetric load comprises a fifth NMOS transistor and a sixth NMOS transistor, the third symmetric load comprises a seventh NMOS transistor and an eighth NMOS transistor, the fifth PMOS transistor has a source connected to the high voltage, a gate connected to the first bias signal and a drain connected to sources of the sixth and the seventh PMOS transistors, the sixth PMOS transistor has a drain connected to a drain and gate of the fifth NMOS transistor and a drain of the sixth NMOS transistor, the seventh PMOS transistor has a drain connected to a drain and gate of the eight NMOS transistor and a drain of the seventh NMOS transistor, the sixth and the seventh NMOS transistor respectively have a gate connected to the second bias signal, the fifth, the sixth, the seventh and the eighth NMOS transistors respectively have a source connected to the low voltage, the first capacitance bank is connected to the gate of the fifth NMOS transistor, and the second capacitance bank is connected to the gate of the eighth NMOS transistor.

8. The frequency synthesizer as claimed in claim 7, wherein each of the first and the second capacitance banks from the delay cell comprises a plurality of capacitance selectors having N capacitors and N switches where N is a positive integer.

9. The frequency synthesizer as claimed in claim 8, wherein each of the N switches is an NMOS transistor.

10. The frequency synthesizer as claimed in claim 8, wherein each of the capacitors is a metal-insulator-metal (MIM) capacitor.

11. The frequency synthesizer as claimed in claim 1, wherein the differential-to-single-ended converter is a frequency divider with a divisor of two to thereby improve positive and negative edge symmetry of the output signal.

12. The frequency synthesizer as claimed in claim 6, wherein the capacitors of the first and the second capacitance banks are expressed as:

$$(C_{Paracitic}+B[1] \times C_{B1}+B[2] \times C_{B2}+B[3] \times C_{B3}+B[4] \times C_{B4}+B[5] \times C_{B5})$$

where $C_{Paracitic}$ indicates parasitic and stray capacitance, and B[1], B[2], B[3], B[4], B[5] indicate control signals outputted from the capacitance bank controller to each of the first and the second capacitance banks respectively.

13. The frequency synthesizer as claimed in claim 12, wherein a frequency $f_{VCO}$ of the differential output signal outputted by the controllable oscillator is expressed as:

$$f_{VCO} = \frac{g_m}{C_B}$$
$$= \frac{g_m}{2n \times C_{Eff}}$$
$$= \frac{g_m}{2n \times \begin{pmatrix} C_{Eff} + CB[1] \times C_{B1} + CB[2] \times C_{B2} + \\ CB[3] \times C_{B3} + CB[4] \times C_{B4} + \\ CB[5] \times C_{B5} \end{pmatrix}}$$

where $C_B$ indicates a capacitance of the controllable oscillator, n indicates the number of delay cells, $C_{Eff}$ indicates a capacitance of the delay cells, and $g_m$ indicates a transconductance of the delay cells.

14. A frequency synthesizer, comprising:
a detector, for generating a detection signal based on a logic level difference between an input signal and a feedback signal;
a charge pump, connected to the detector, for generating a control signal based on the detection signal;
a low pass filter connected to the charge pump, for generating a tuning signal based on the control signal;
a bias circuit connected to the low pass filter, for generating a first bias signal and a second bias signal based on the tuning signal;
a controllable oscillator, connected to the bias circuit, for generating a differential output signal based on the first and the second bias signals, the controllable oscillator including an oscillator comprised of a plurality of delay cells, and a capacitance bank controller for controlling the delay cells to generate the differential output signal for further selecting a specific frequency thereby dynamically providing load capacitance to the plurality of delay cells and filtering out phase errors of the controllable oscillator;
a differential-to-single-ended converter, connected to the controllable oscillator, for converting the differential output signal into an output signal; and
a programmable frequency divider, connected to the differential-to-single-ended converter, for generating the feedback signal based on the output signal,
wherein the bias circuit comprises an operational amplifier, a first PMOS transistor, a second PMOS transistor, a first NMOS transistor, a second NMOS transistor and a voltage buffer, the operational amplifier has an output terminal connected to a gate of the first PMOS transistor, the first PMOS transistor has a source connected to a high voltage and a drain connected to a source of the second PMOS transistor, the second PMOS transistor has a gate connected to the low voltage and a drain connected to a non-inverse input terminal of the operational amplifier, and the gate and the drain of the first NMOS transistor, the gate and the drain of the second NMOS transistor and the sources of the first and the second NMOS transistors are respectively connected to the low voltage.

15. The frequency synthesizer as claimed in claim 14, wherein the voltage buffer comprises a third PMOS transistor, a fourth PMOS transistor and a first symmetric load.

16. The frequency synthesizer as claimed in claim 15, wherein the first symmetric load comprises a third NMOS transistor and a fourth NMOS transistor.

17. The frequency synthesizer as claimed in claim 16, wherein the output terminal of the operational amplifier is connected to a gate of the third PMOS transistor to thereby generate the first bias signal, the third PMOS transistor has a source connected to the high voltage and a drain connected to a source of the fourth PMOS transistor, the fourth PMOS transistor has a gate connected to the low voltage and a drain respectively connected to gates and drains of the third and the fourth NMOS transistors to thereby generate the second bias signal, and the third and the fourth NMOS transistors respectively have a source connected to the low voltage.

18. A frequency synthesizer, comprising:
- a detector, for generating a detection signal based on a logic level difference between an input signal and a feedback signal;
- a charge pump, connected to the detector, for generating a control signal based on the detection signal;
- a low pass filter connected to the charge pump, for generating a tuning signal based on the control signal;
- a bias circuit connected to the low pass filter, for generating a first bias signal and a second bias signal based on the tuning signal;
- a controllable oscillator, connected to the bias circuit, for generating a differential output signal based on the first and the second bias signals, the controllable oscillator including an oscillator comprised of a plurality of delay cells, and a capacitance bank controller for controlling the delay cells to generate the differential output signal for further selecting a specific frequency thereby dynamically providing load capacitance to the plurality of delay cells and filtering out phase errors of the controllable oscillator;
- a differential-to-single-ended converter, connected to the controllable oscillator, for converting the differential output signal into an output signal; and
- a programmable frequency divider, connected to the differential-to-single-ended converter, for generating the feedback signal based on the output signal,
- wherein the differential-to-single-ended converter is a frequency divider with a divisor of two to thereby improve positive and negative edge symmetry of the output signal.

* * * * *